(12) United States Patent
DeCusatis et al.

(10) Patent No.: US 6,911,090 B2
(45) Date of Patent: Jun. 28, 2005

(54) REAL-TIME PROCESS CONTROL FOR OPTICAL COMPONENT FABRICATION

(75) Inventors: Casimer M. DeCusatis, Poughkeepsie, NY (US); Lawrence Jacobowitz, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 488 days.

(21) Appl. No.: 09/976,545

(22) Filed: Oct. 12, 2001

(65) Prior Publication Data

US 2003/0072869 A1 Apr. 17, 2003

(51) Int. Cl.[7] .......................... C23C 16/00; H05H 1/00; H05H 1/02; C23F 1/00; H01L 21/00
(52) U.S. Cl. ..................... 118/712; 156/345.24; 427/8
(58) Field of Search ............... 118/712, 715; 156/345.24, 345.26, 345.25; 427/8, 9, 10

(56) References Cited

U.S. PATENT DOCUMENTS

| | | | |
|---|---|---|---|
| 3,713,042 A | * 1/1973 | Kinsel | 372/18 |
| 4,311,725 A | * 1/1982 | Holland | 427/10 |
| 4,332,833 A | * 6/1982 | Aspnes et al. | 427/8 |
| 5,658,418 A | * 8/1997 | Coronel et al. | 156/345.25 |
| 5,737,109 A | * 4/1998 | Goodwin | 398/197 |
| 6,712,927 B1 | * 3/2004 | Grimbergen et al. | 156/345.24 |

FOREIGN PATENT DOCUMENTS

JP 10336154 A * 12/1998 ............ H04J/14/08

OTHER PUBLICATIONS

Bann, R., et al., "Micromachining system accommodates large wafers," Laser Focus World, www.optoelectronics-world.com, pp. 189–192, Jan. 2001.

Kartalopoulos, S.,"Introduction to DWDM Technology Data in a Rainbow," IEEE, Chapter 3, pp. 67–68, (1999).

Carroll, J., et al.,"Distributed feedback semiconductor lasers," IEE Circuits, Devices and Systems Series 10, SPIE Press Monograph, vol. PM52, pp. 9–15, (1998).

* cited by examiner

*Primary Examiner*—Parviz Hassanzadeh
(74) *Attorney, Agent, or Firm*—Scully, Scott, Murphy & Presser; Lisa U. Jaklitsch

(57) ABSTRACT

A method and system for controlling the fabrication of an optical device having a given property at a defined wavelength. The method comprises the steps of providing a substrate, depositing a material on the substrate to form a film thereon, and controlling a set of manufacturing parameters as the film is being formed on the substrate to make the optical device. The method comprises the further steps of generating an optical signal having a given wavelength, dithering the wavelength of the optical signal, and applying the dithered optical signal to the film being formed on the substrate to modulate the optical signal. A correlation signal is generated to represent the difference between the given wavelength and the defined wavelength, and that correlation signal is used to adjust at least one of the manufacturing parameters to make the optical device with said given property at the defined wavelength.

9 Claims, 4 Drawing Sheets

REAL-TIME PROCESS CONTROL FOR OPTICAL COMPONENT FABRICATION

BACKGROUND OF THE INVENTION

1. Field of the Invention

This invention generally relates to the fabrication of optical components, and more specifically, to methods and systems for fabricating optical devices so as to have a given property at a defined wavelength. Even more specifically, the invention relates to methods and systems that may be used to provide active, real-time control of thin film deposition processes using a non-contact and non-disruptive measurement procedure.

2. Prior Art

Many optical communication systems rely on wavelength selective components; some examples include optical add/drop filter banks for wavelength multiplexing, optical isolators which prevent backreflection noise in laser transceivers, and bandpass filters which reduce the optical bandwidth of photodiode receivers to minimize noise and interference. All of these components are commonly fabricated using thin film coatings on optical substrates. These optical films can be less than one-quarter of a wavelength thick in the optical communication range (1300–1500 nm infrared). In particular, wavelength multiplexing systems may require only a few parts per million tolerance on the optical components in a link. These techniques also apply to fabrication of optical surface waveguides, switches, and other components. There are certainly other applications which use filters at different wavelengths (for example, spectroscopy and optical microscopy).

The fabrication of conventional optical filters and related components involves precision control of the glass composition both to control impurities and to insure accurate refractive index profiles. High purity materials and well controlled tolerances are important to the manufacturing process. Very pure optical materials are used, so the dominant factor in optical quality of the finished components is the accuracy with which the process tolerances can be controlled common manufacturing methods include chemical vapor deposition (CVD), in which layers of material are successively built up on a substrate. Multilayer filters can also be produced by using this process in successive steps. As an example of the CVD process, submicron silica particles are produced through one or both of the following chemical reactions, carried out at temperatures of around 1800–2000° C.:

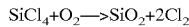

$SiCl_4 + O_2 \rightarrow SiO_2 + 2Cl_2$

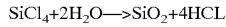

$SiCl_4 + 2H_2O \rightarrow SiO_2 + 4HCL$

This deposition produces a high purity silica soot which is then sintered to form optical quality glass. There are several variations on this approach, including modified chemical vapor deposition (MCVD) and plasma-enhanced chemical vapor deposition (PECVD). In both cases, layers of material are successively deposited, controlling the composition at each step, in order to reach the desired film thickness, refractive index profile, or optical transmission and reflection coefficients.

MCVD accomplishes this deposition by application of a heat source, such as a torch, over a small area on the substrate. This heat is necessary for sintering the deposited $SiO_2$ and for the oxidation reactions shown above. Submicron particles are deposited at the leading edge of the heat source; as the heat moves over these particles, they are sintered into a layered, glassy deposit. This requires fairly precise control over the temperature gradients in the tube, but has the advantage of accomplishing the sintering and deposition in one step. The precise control required in this case results in low yields and high manufacturing costs; it also means that the exact optical transfer function (OTF) of the filters cannot be controlled, so there is unavoidable performance degradation when filters made by such a process are paired with arbitrary wavelength optical sources. Nevertheless, MCVD accounts for a large portion of the optical fiber produced today, especially in Europe and America, and this process is the basis of a multi-billion dollar annual market.

By contrast, the PECVD process provides the necessary energy for the chemical reactions by direct radio frequency (RF) excitation of a microwave generated plasma. Since the microwave field can be moved very quickly along the substrate (since it heats the plasma directly, not the substrate itself), it is possible to traverse the substrate thousands of times and deposit very thin layers at each pass. Currently, there is no method for precise control of the layers or OTF at each step of this process, which again results in low yields and higher costs. A separate step is then required for sintering of the glass. In both MCVD and PECVD cases, the substrates often require a final heating to around 2150° C. in a furnace to anneal the substrate and thin films.

In an alternate embodiment, a rotating substrate is used for subsequent CVD; an external torch fed by carrier gasses is used to supply the chemical components for the reaction, as well as to provide the necessary heat for the reaction to occur. Two such processes which have been widely used, particularly in Japan, are the outside vapor deposition (OVD) and the vapor axial deposition (VAD) methods. Much of the control in these techniques lies in the construction of the torch, and hence is not very precise.

For example, OVD is basically a flame hydrolysis process in which the torch consists of discrete holes in a pattern of concentric rings which each provide a different constituent element for the chemical reactions; a stream of oxygen is used between successive rings to act as a shield between the different chemicals. The torch is moved back and forth along the rotating preform and the dopants in the flame are dynamically controlled to generate the desired optical profile. OVD has well documented problems because of its high cost (substrates are limited in size, as it is a batch process) and technical problems such as difficulty in removing all the water (OH groups) from the formed glass and a tendency for the filters to have a large depression in refractive index near the middle.

The VAD process is similar in concept, using a set of concentric annular apertures in the torch; in this case, the preform is pulled slowly across the stationary torch. It has been shown that by mixing dopants into the $SiCl_4$—$O_2$ feed, the proportion of dopant deposited with the silica varies with the temperature of the flame; if a wide flame is used, the temperature gradient produces a graded portion of dopants. This process has also proven to be difficult to control at the precision tolerances required for wavelength multiplexer system components.

SUMMARY OF THE INVENTION

An object of the present invention is to improve methods and systems for controlling thin film deposition processes.

Another object of the present invention is to achieve very precise control of the optical properties of optical devices being fabricated, and to achieve higher yield, lower cost and more consistent product.

A further object of the invention is to provide active, real time control of the various thin film deposition processes, such as CVD processes, using feedback control through a state machine with a wavelength locked loop.

These and other objectives are attained with a method and system for controlling the fabrication of an optical device having a given property at a defined wavelength. The method comprises the steps of providing a substrate, depositing a material on the substrate to form a film therein, and controlling a set of manufacturing parameters as the film is being formed on the substrate to make the optical device. The method comprises the further steps of generating an optical signal having a given wavelength, dithering the wavelength of the optical signal, and applying the dithered optical signal to the film being formed on the substrate to modulate the optical signal. A correlation signal is generated to represent the difference between the given wavelength and the defined wavelength, and that correlation signal is used to adjust at least one of the manufacturing parameters to make the optical device with said given property at the defined wavelength.

The preferred embodiment of the invention, described below in detail, provides for active, real time control of the various thin film deposition processes using feedback control through a state machine with a wavelength locked loop. The basic operating principle of the wavelength-locked loop (WLL) is described in greater detail in commonly-owned, co-pending U.S. patent application Ser. No. 09/865,256, entitled APPARATUS AND METHOD FOR WAVELENGTH-LOCKED LOOPS FOR SYSTEMS AND APPLICATIONS EMPLOYING ELECTROMAGNETIC SIGNALS, the whole contents and disclosure of which is incorporated by reference as if fully set forth herein. The use of this wavelength locked loop feedback control allows for very precise control of the optical properties of the filters being fabricated, and makes it possible to achieve higher yield, lower cost, and more consistent product. Furthermore, this preferred embodiment of the invention allows for the measurement of the complete optical transfer function of the components using light sources representative of the intended application. This is not possible with conventional thin film deposition processes. An important characteristic of a wavelength locked loop is the ability to dynamically adjust the offset between the peak of a Gaussian filter function and the center wavelength of an optical signal passing through the filter. This can be used, for example, to optimize the alignment between the filter peak and the optical source.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
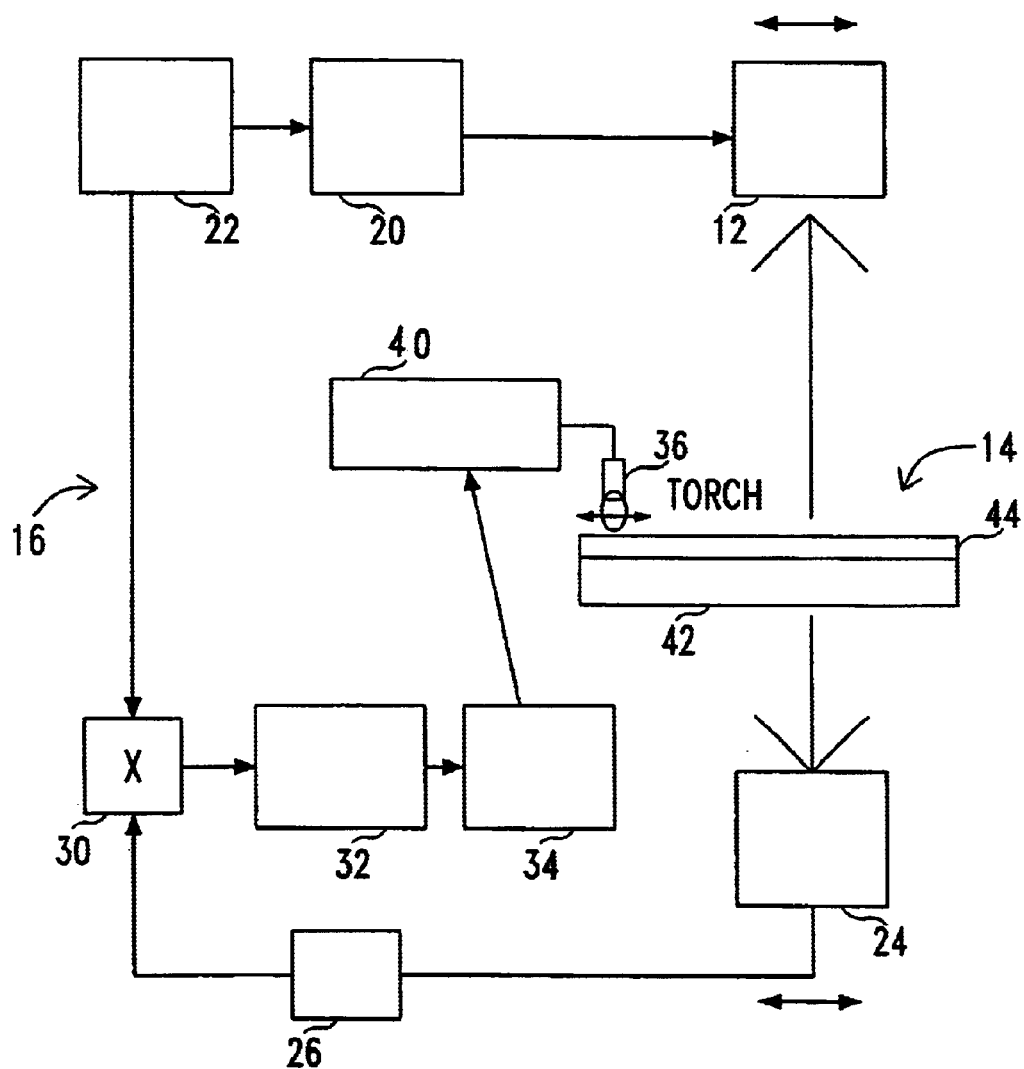
FIG. 1 is a block diagram illustrating one embodiment of the invention.

FIG. 1 illustrates the present invention in an MCVD process. It should be understood, however, that other thin film deposition techniques, and in particular other CVD processes, can be similarly controlled as an alternate embodiment. Preferably, in the case illustrated in FIG. 1, the laser diode 12 is chosen to be representative of the application that will use the optical filter (center wavelength, spectral width, and other optical properties). In this case, the transmission properties of the filter 14 are being measured as the filter is fabricated, and a feedback control loop 16 is used to adjust the CVD deposition rate. Other properties may also be controlled such as the temperature, doping content, etc. to achieve various effects. The optical output power and wavelength of the source remain constant.

More specifically, the system 10 shown in FIG. 1 includes laser diode 12, which is controlled from voltage bias source 20. System 10 further includes sinusoidal dither source 22, PIN diode 24, amplifier 26, signal multiplier 30, low pass filter 32, and 30 integrate/digitize unit 34. FIG. 1 also shows an optical filter 14 being fabricated, torch 36 and torch control 40. Filter 14, in turn, is comprised of a substrate 42 and a thin film 44 being formed on the substrate.

In the operation of system 10, the laser voltage bias is modulated by a dithering current from the signal generator 22 at a low modulation frequency (kH or less is adequate; this may be adjusted as needed to avoid interference with other operating frequencies in the system). Variations in the laser bias produce a corresponding dither in the center wavelength of the laser output. This light passes through the optical filter 14 as it is being fabricated; this is a non-contact and non-disruptive measurement procedure. The filter under fabrication is a bandpass filter whose filter response is to be tuned to match the laser diode wavelength. Using conventional methods, the laser and filter are made with different manufacturing processes, tolerances, etc. and hence there is a high optical loss between an arbitrarily selected laser and receiver (up to 4 dB or more).

The light emerging from the filter under fabrication is amplitude modulated by the mismatch between the laser center wavelength and the filter center wavelength. The output light from the filter passes to a photodetector 24. The detector's electrical output signal is amplified at 26 and fed back to a control circuit, where it is multiplied at 30 by the original sinusoidal dither. This results in the cross product of the two signals; by low pass filtering the result at 32 to remove higher order terms, then integrating and digitizing the result at 34, we obtain a signal which is proportional to the offset between the laser 12 and filter 14 center wavelengths. This offset signal is of significant utility; the signal determines whether the laser and filter are properly aligned, and if they are not, it provides both the amount and direction in which the filter center wavelength must be moved to become properly aligned with the laser.

This signal then passes into a digital logic circuit which controls the properties of the CVD system (such as the torch temperature and flame diameter, speed of torch movement, concentration of dopants in the flame, etc.). More than one CVD process parameter can be controlled at the same time using this invention. This circuit compares the state of the optical output from the laser/filter combination with the desired state of an ideal filter (this can either be derived from training the system by inserting a known good filter, or from a computer generated model of an ideal filter. Alternately, different models/ideal filters may be used as benchmarks for controlling different stages of the process to achieve an even finer degree of control).

If the feedback signal corresponds to the desired filter performance (within acceptable process tolerances), then no change is made to the state of the CVD process; in this case, the feedback control signal is frequency doubled with respect to the dither signal. If the filter properties are not optimal, the control circuit makes changes as required to bring the filter properties into agreement with the ideal filter. This is possible because system 110 determines both the amount and direction in which the laser and filter are misaligned. In this manner, this invention is used to produce a state machine (stable feedback loop) which controls the filter properties as it is being fabricated.

Figure 2:
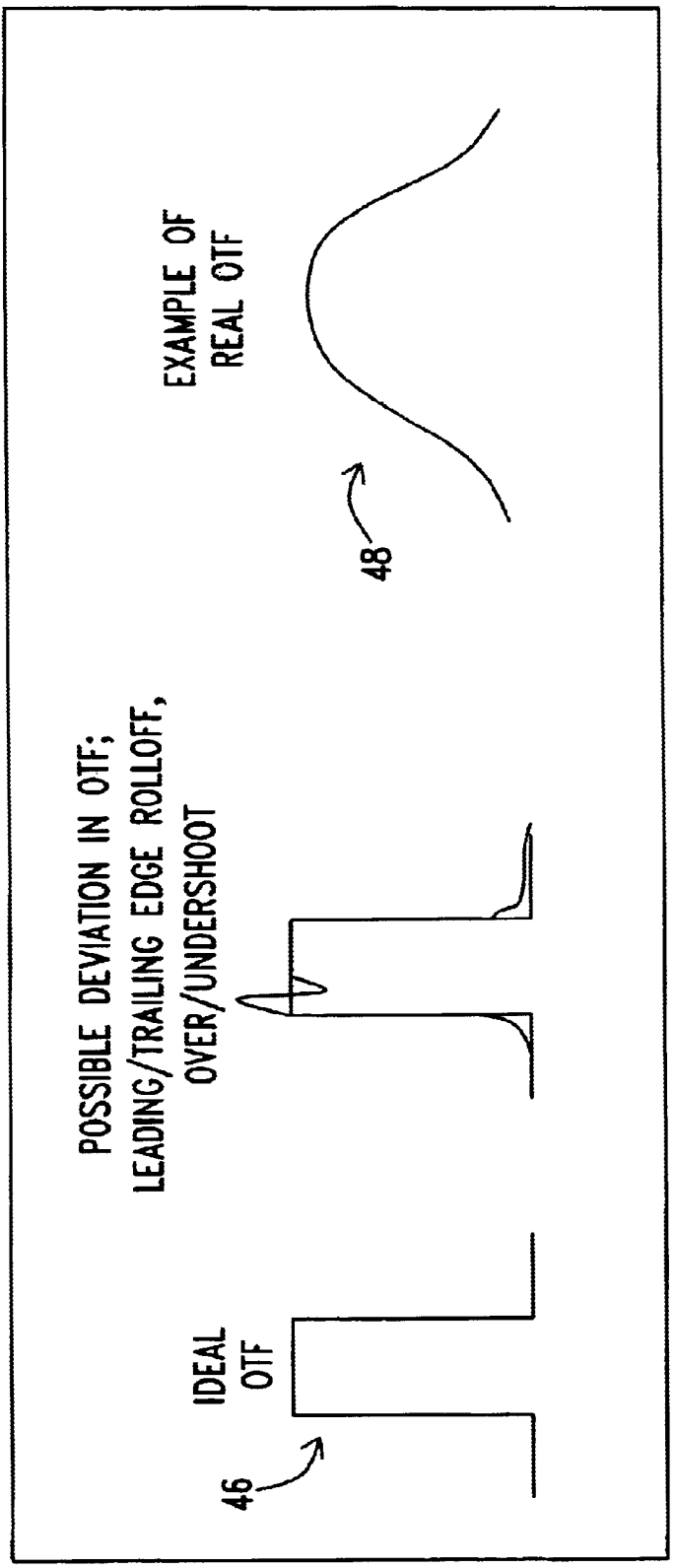
FIG. 2 is a block diagram showing a second embodiment of the invention.
Figure 3:
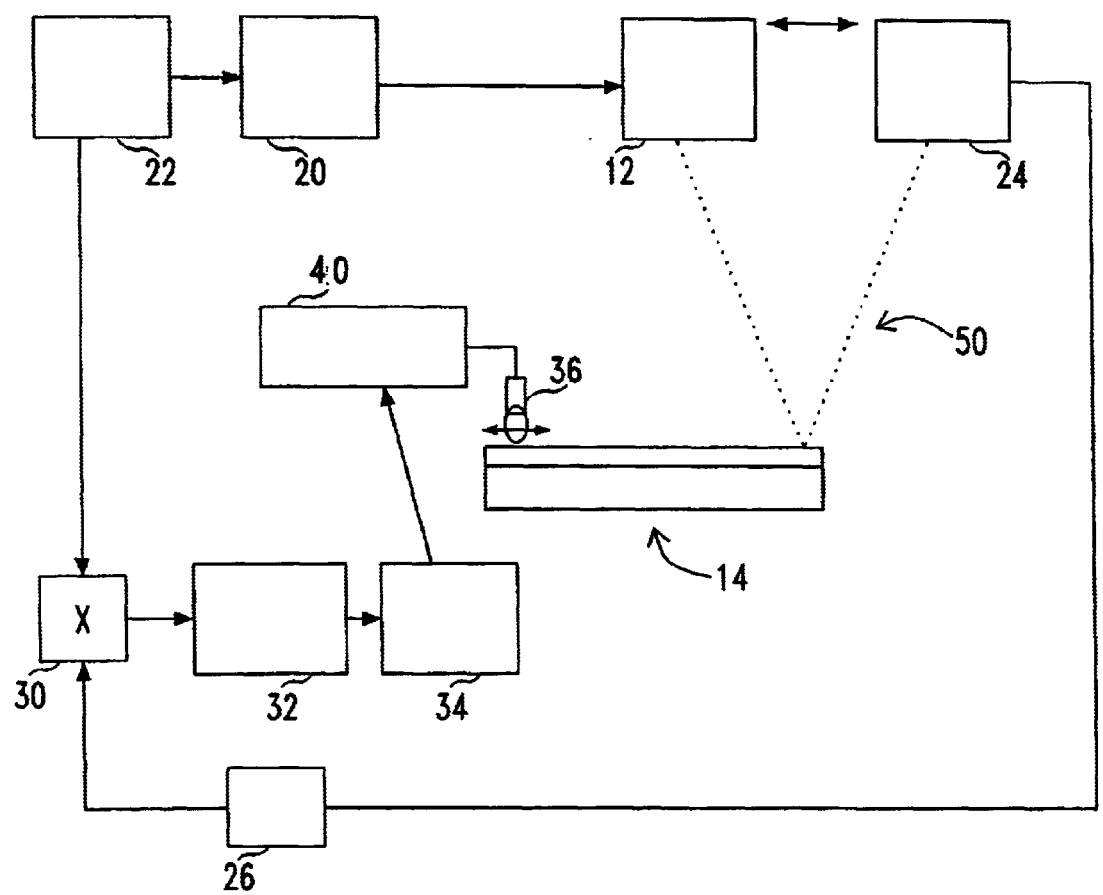
FIG. 3 depicts an ideal optical transfer function, factors that interfere with obtaining that ideal function, and a more realistic optical transfer function.

Many alternate embodiments of this invention are possible. For example, in the preferred embodiment both the laser source and photodetector may be moved along the substrate synchronized with the torch movement to provide real time feedback as each layer of the filter is deposited. The laser and diode can also be adjusted in real time by means of servo motors or other means to illuminate the filter at various angles of incidence. In this manner, the complete OTF of the filter may be measured; examples of the ideal and measured OTFs are shown at 46 and 48 respectively in FIG. 2. FIG. 3 shows at 50 how the filter's reflection rather than transmission may be monitored. Also, in any of these embodiments, the laser and PIN photodiode may be replaced by an array of light sources and detectors to monitor a larger area of the filter, or to monitor behavior simultaneously at different wavelengths, angles, or any other suitable parameter.

The present invention may be used to make a wide range of wavelength selective components. For instance, in addition to bandpass filters, the invention may be used to fabricate optical isolators and optical add/drop filter banks for wavelength multiplexing.

Figure 4:
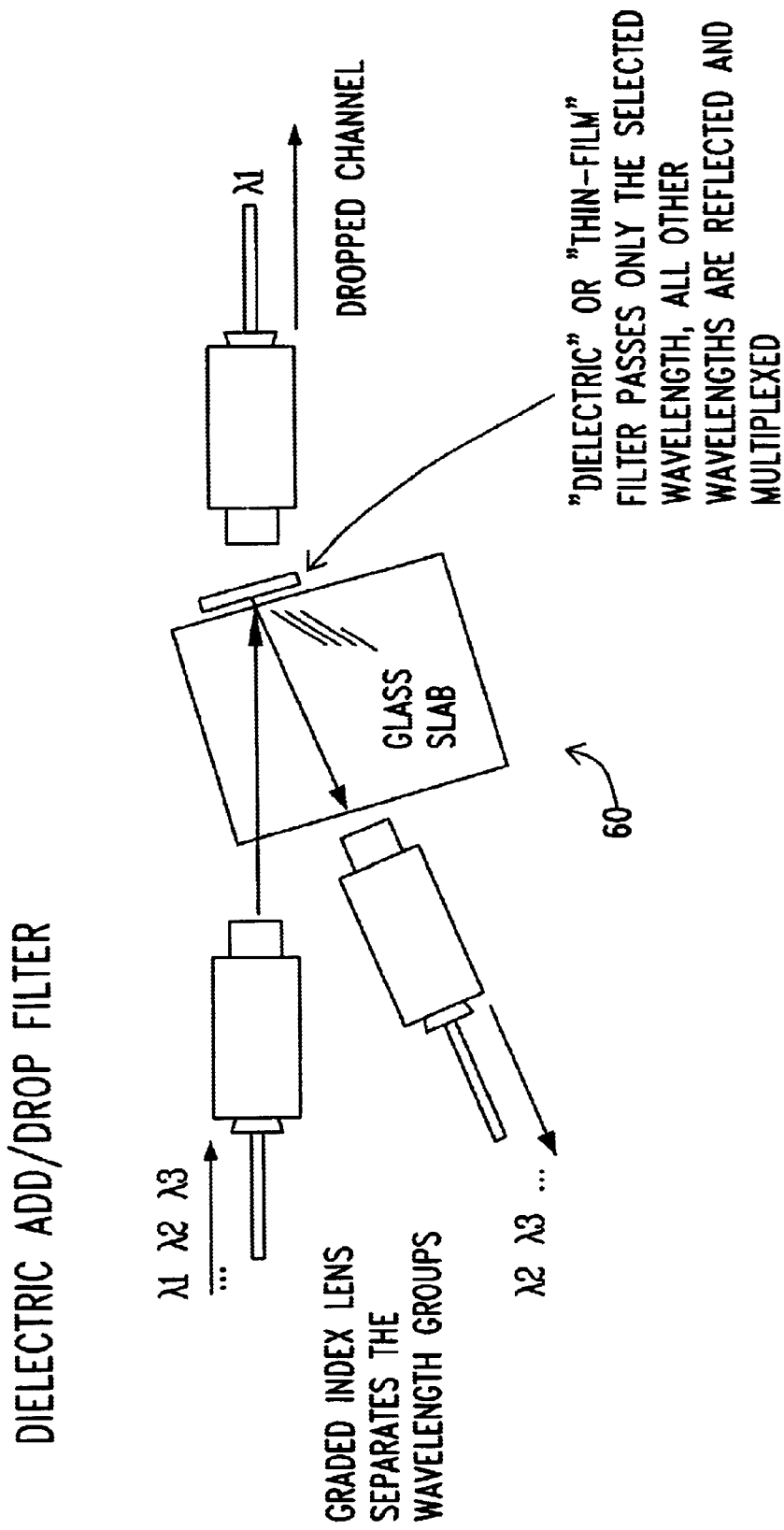
FIG. 4 shows an add/drop filter that can be made using the present invention.

An example of an optical add/drop bank that may be made using this invention is shown at 60 in FIG. 4.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the resent invention.

What is claimed is:

1. A system for controlling the fabrication of an optical device having a given property at a defined wavelength, the system comprising:
   means for depositing a material on an optical substrate to form a film thereon;
   a control subsystem for controlling a set of manufacturing parameters as the film is being formed on the substrate to make the optical device;
   a light subsystem for generating an optical signal having a given wavelength and for applying the optical signal to the film being formed on the substrate to modulate the optical signal;
   a dither source for generating a dither signal for dithering the given wavelength of the optical signal;
   a feedback circuit for generating a correlation signal representing the difference between the dithered given wavelength of the optical signal and the defined wavelength, and for using the correlation signal to adjust at least one of the manufacturing parameters to make the optical device with said given property at the defined wavelength.

2. A system according to claim 1, wherein the feedback circuit provide a real-time control of the fabrication of the optical element.

3. A system according to claim 1, wherein the film transmits a signal modulated by the difference between the defined wavelength and the given wavelength of the optical signal, and the control circuit includes a sensor to receive the signal transmitted from the film and to generate a signal representing said difference.

4. A system according to claim 3, wherein the feedback circuit processes the signal generated by the sensor to generate the correlation signal.

5. A system according to claim 1, wherein the light subsystem directs the optical signal through the film.

6. A system according to claim 1, wherein the light subsystem directs the optical signal to the film, and the optical signal is then reflected from the film.

7. A system according to claim 1, wherein:
   the depositing means includes means for depositing the material on the substrate at an adjustable rate; and
   the feedback circuit includes means for using the correlation signal to adjust the rate at which the material is being deposited on the substrate.

8. A system according to claim 7, further comprising a voltage bias source located in series between the dither service and the light subsystem, and wherein:
   the voltage bias source generates a voltage signal and applies said voltage signal to the light subsystem; and
   the dither source applies the dither signal to the voltage bias source to dither said voltage signal to cause said dithering of the given wavelength of the optical signal.

9. A system according to claim 8, wherein:
   the optical signal interacts with the film being formed to generate a derived optical signal; and
   the feedback circuit includes a multiplier to multiply the derived optical signal and the dither signal.

* * * * *